(12) United States Patent
Lewis (10) Patent No.: US 7,167,021 B1
(45) Date of Patent: Jan. 23, 2007

(54) LOGIC DEVICE LOGIC MODULES HAVING IMPROVED ARITHMETIC CIRCUITRY

(75) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/723,530

(22) Filed: Nov. 24, 2003

(51) Int. Cl.
*G06F 7/38* (2006.01)
(52) U.S. Cl. ............................. 326/37; 326/38; 326/41
(58) Field of Classification Search ............ 326/37–41, 326/46, 47
See application file for complete search history.

(56) References Cited

U.S. PATENT DOCUMENTS

| | | | |
|---|---|---|---|
| 5,258,668 A | 11/1993 | Cliff et al. ................. 307/465 |
| 5,274,581 A | 12/1993 | Cliff et al. ................. 364/784 |
| 5,295,090 A | 3/1994 | Hsieh et al. ................ 364/784 |
| 5,349,250 A | 9/1994 | New .......................... 307/465 |
| 5,359,242 A | 10/1994 | Veenstra ..................... 307/465 |
| 5,365,125 A | 11/1994 | Goetting et al. .............. 326/39 |
| 5,481,206 A | 1/1996 | New et al. .................... 326/38 |
| 5,481,486 A | 1/1996 | Cliff et al. .................. 364/716 |
| 5,483,478 A | 1/1996 | Chiang ....................... 364/787 |
| 5,500,608 A | 3/1996 | Goetting et al. .............. 326/39 |
| 5,523,963 A | 6/1996 | Hsieh et al. ................. 364/786 |
| 5,546,018 A | 8/1996 | New et al. .................... 326/39 |
| 5,629,886 A | 5/1997 | New .......................... 364/787 |
| 5,631,576 A | 5/1997 | Lee et al. ..................... 326/39 |
| 5,672,985 A | 9/1997 | Lee .......................... 326/41 |
| 5,675,262 A | 10/1997 | Duong et al. ................. 326/41 |
| 5,724,276 A | 3/1998 | Rose et al. ............. 364/716.06 |
| 5,761,099 A | 6/1998 | Pedersen ............... 364/716.01 |
| 5,818,255 A | 10/1998 | New et al. .................... 326/39 |
| 5,889,411 A * | 3/1999 | Chaudhary .................... 326/39 |
| 5,898,318 A | 4/1999 | Pederson ..................... 326/39 |
| 5,898,319 A | 4/1999 | New .......................... 326/41 |
| 5,898,602 A | 4/1999 | Rothman et al. ......... 364/716.01 |

(Continued)

OTHER PUBLICATIONS

Altera Corporation, "Stratix Device Handbook, vol. 1," Jul. 2003, pp. 1-1-1-2, 2-3-2-14.

(Continued)

*Primary Examiner*—Anh Q. Tran
(74) *Attorney, Agent, or Firm*—Fish & Neave IP Group of Ropes & Gray LLP; Robert R. Jackson (57) ABSTRACT

A logic device logic module includes multi-stage combinational logic circuitry (e.g., a four-input look-up table) into which EXCLUSIVE OR ("XOR") circuitry is interposed to give the logic module arithmetic as well as combinational logic capabilities. The XOR circuitry is used to help form an arithmetic sum output signal (as an alternative to a combinational logic output signal) when arithmetic mode operation is desired. The logic module is also augmented with circuitry for providing a carry out signal in arithmetic mode. The logic module can perform such arithmetic operations as one digit or bit of binary addition, subtraction, or multiplication. In all cases a carry in signal is taken into account; and in the case of multiplication, a digit from another partial product or summation of other partial products is also taken into account.

37 Claims, 7 Drawing Sheets

U.S. PATENT DOCUMENTS

| | | | |
|---|---|---|---|
| 6,107,827 A * | 8/2000 | Young et al. | 326/41 |
| 6,154,052 A | 11/2000 | New | 326/41 |
| 6,154,053 A | 11/2000 | New | 326/41 |
| 6,157,209 A | 12/2000 | McGettigan | 326/39 |
| 6,288,570 B1 | 9/2001 | New | 326/41 |
| 6,359,468 B1 * | 3/2002 | Park et al. | 326/39 |
| 6,427,156 B1 | 7/2002 | Chapman et al. | 708/235 |
| 6,480,023 B1 | 11/2002 | Kaviani | 326/38 |
| 6,529,040 B1 | 3/2003 | Carberry et al. | 326/40 |
| 6,633,181 B1 * | 10/2003 | Rupp | 326/40 |
| 2002/0116426 A1 * | 8/2002 | Swami | 708/235 |

OTHER PUBLICATIONS

Xilinx, Inc., "Virtex-II Platform FPGAs: Introduction and Overview," Product Specification, Version 2.0, Aug. 1, 2003, p. 1.

Xilinx, Inc., "Virtex-II Platform FPGAs: Detailed Description," Product Specification, Version 3.0, Aug. 1, 2003, pp. 12-18.

U.S. Appl. No. 10/195,209, filed Jul. 12, 2002, Kaptanoglu et al.

U.S. Appl. No. 10/280,723, filed Oct. 24, 2002, Lewis et al.

* cited by examiner

LOGIC DEVICE LOGIC MODULES HAVING IMPROVED ARITHMETIC CIRCUITRY

BACKGROUND OF THE INVENTION

This invention relates to logic devices such as programmable logic devices ("PLDs"), and more particularly to the logic modules used in such devices.

Logic devices typically include many instances (replications) of basic circuitry called a logic module. Because this basic circuit unit is replicated so many times on a logic device, it is very important for it to be both powerful and efficient. By "powerful" it is meant that the logic module is capable of as many different, commonly needed tasks as is reasonably possible. By "efficient" it is meant that the logic module does not include more circuit elements than necessary, that it is not characterized by any more signal propagation delay than necessary, etc.

A typical logic module is capable of providing a primary output signal that is any logical function of a predetermined number of primary input signals to the logic module. For example, it is very common for a logic module to have four primary input signals. It is also frequently desirable for a logic module to be able to perform one digit or bit of binary addition (or subtraction) and one digit or bit of binary multiplication. (For ease of reference herein, "addition" will generally be understood to also include subtraction.) Parallel addition or multiplication of several digits or bits of binary data is typically what is desired, so several logic modules are typically involved. To help support such parallel arithmetic operations, carry connections may be provided between logic modules. In other words, in addition to its primary inputs and its primary output, a logic module may have a carry in input that comes substantially directly from another adjacent or nearby logic module, and a carry out output that goes substantially directly to yet another adjacent or nearby logic module. In the case of addition, for example, a logic module receives two addend signals via two of its primary inputs; it receives a carry in signal (from the logic module performing the next-less-significant digit position of the addition) via its carry in input; it produces a sum out signal via its primary output; and it outputs a carry out signal (for use by the logic module performing the next-more-significant digit position of the addition) via its carry out output.

Logic module circuitry is needed for efficiently augmenting the basic combinational logic capability of a logic module with arithmetic capability (e.g., the handling of a carry in input, the production of a carry out output, and the performance of one digit or bit of an arithmetic operation such as addition or multiplication).

SUMMARY OF THE INVENTION

Logic module circuitry having both combinational logic and arithmetic capabilities in accordance with the invention includes combinational logic circuitry having at least first, second, and third stages, and EXCLUSIVE OR ("XOR") circuitry interposed between two of the stages or between the third stage and an output of the combinational logic circuitry. The XOR circuitry can logically combine a carry in signal with at least one combinational signal in the combinational logic circuitry. This allows the primary output signal of the logic module to be either (1) a logical function of primary inputs to the logic module, or (2) the arithmetic sum of the carry in signal and at least some of the primary inputs (or signals derived from at least some of the primary inputs). For example, the sum out signal may be the arithmetic sum of the carry in signal and two of the primary inputs (for addition), or the sum of the carry in signal, the product of two primary inputs, and a third primary input (for multiplication). The logic module circuitry also preferably includes circuitry for producing a carry out signal from the carry in signal and combinational signals in the combinational logic circuitry.

A method of operating combinational logic having at least first, second, and third stages includes, in accordance with the invention, using XOR circuitry that is connected between two of the stages or between the third stage and an output of the combinational logic circuitry to logically combine a carry in signal with at least one combinational signal produced by the combinational logic.

Further features of the invention, its nature and various advantages will be more apparent from the accompanying drawings and the following detailed description of the preferred embodiments.

DETAILED DESCRIPTION

Figure 1:
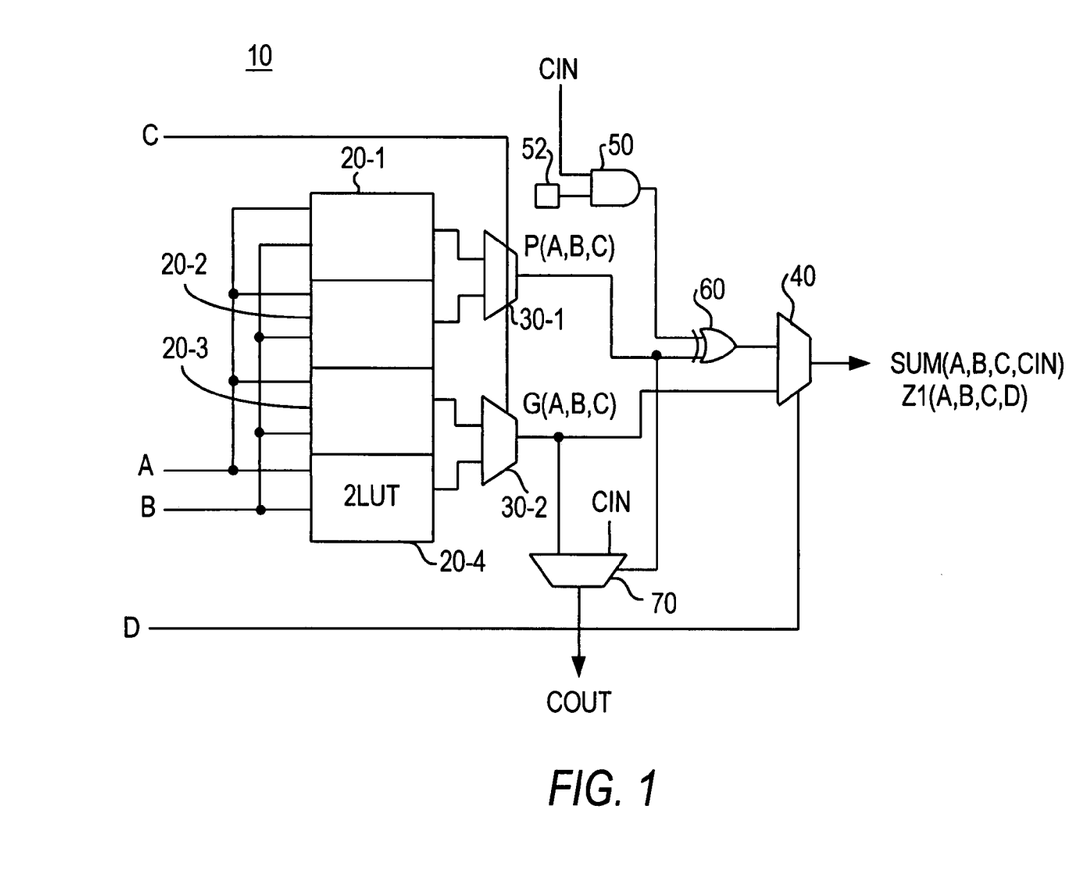
FIG. 1 is a simplified schematic block diagram of an illustrative embodiment of logic module circuitry in accordance with the invention.

The illustrative embodiment of logic module circuitry 10 shown in FIG. 1 includes four-input look-up table ("LUT") circuitry to which only a few elements have been added to facilitate arithmetic operation. The basic four-input LUT circuitry includes four two-input LUTs 20-1 through 20-4, multiplexers 30-1 and 30-2, and multiplexer 40. This circuitry is four-stage combinational logic circuitry, in which LUTs 20 constitute the first two stages, multiplexers 30 constitute the third stage, and multiplexer 40 constitutes the fourth stage.

LUTs 20-1 through 20-4 include 16 bits of programmable memory, distributed as four bits per LUT. Each of LUTs 20 receives two of the four primary inputs to the logic module. In particular, each of LUTs 20 receives primary inputs $a$ and $b$. The other two primary inputs are $c$ and $d$. Each of LUTs 20 uses inputs $a$ and $b$ as address bits to select one of the four memory bits of that LUT and to thereby cause the data value stored in the selected memory bit to be output by that LUT. Multiplexer ("MUX") 30-1 receives the outputs of LUTs 20-1 and 20-2 and selects one of those signals to be its output based on the logic level of primary input c. MUX 30-2 similarly receives the outputs of LUTs 20-3 and 20-4 and selects one of those signals to be its output based on the logic level of c. Ignoring EXCLUSIVE OR ("XOR") gate 60 for the moment, MUX 40 receives the outputs of MUXs 30-1 and 30-2 and selects one of those signals to be its output based on the logic level of primary input d.

Summarizing the foregoing (and continuing to ignore all elements other than 20, 30, and 40), LUTs 20 make a first two levels of selection from 16 memory bits down to eight, and from eight down to four, based on primary inputs a and b. MUXs 30 make a third level of selection from four down to two, based on primary input c. MUX 40 makes a fourth and final level of selection from two down to one based on primary input d. By appropriately programming the 16 memory bits in LUTs 20, logic module 10 can provide a primary output signal Z1(a,b,c,d) which is any logical function of the four primary inputs a–d.

Arithmetic capability is added to logic module 10 by including AND gate 50, programmable memory bit 52, XOR gate 60, and MUX 70. A carry in signal cin is applied to one input of AND gate 50. The output signal of memory bit 52 is applied to the other input of AND gate 50. If arithmetic operation is not desired, memory bit 52 is programmed to output 0. This keeps the output of AND gate 50 0. The output of AND gate 50 is one input to XOR gate 60, the other input to gate 60 being the output signal of MUX 30-1. As long as the output of AND gate 50 is 0, XOR gate 60 passes the output signal of MUX 30-1. This is appropriate for use of logic module 10 for combinational logic (i.e., to produce Z1(a,b,c,d) as the primary output of the logic module). On the other hand, if arithmetic operation is desired, memory bit 52 is programmed logic 1. This enables AND gate 50 to pass cin to the associated input of XOR gate 60. The output signal of MUX 30-1 now controls whether this cin signal is passed on by XOR gate 60 to MUX 40. If the output signal of MUX 30-1 (the signal p(a,b,c)) is logic 0, cin is passed on (cin can, of course, be 1 or 0). On the other hand, if the output signal of MUX 30-1 is 1, that becomes the output signal of XOR gate 60, unless cin is also 1, in which case the output signal of XOR gate 60 becomes logic 0. In arithmetic mode, primary input d is typically held at logic 0, so that the output of XOR gate 60 is the output of MUX 40, and therefore the sum(a,b,c,cin) output of the depicted logic module circuitry 10. (The notation "sum(a,b,c,cin)" does not mean that this signal is the sum of four variables (a, b, c, and cin), but only that this sum signal is a function of these four inputs. Various examples of functions that this signal can be are described more fully below.)

Continuing with the description of the arithmetic mode aspects of logic module 10, the output signal of MUX 30-2 is applied to one selectable input terminal of MUX 70, and cin is applied to the other selectable input terminal of that MUX. The output signal of MUX 30-1 is the signal that controls the selection made by MUX 70. In particular, if p(a,b,c) is logic 0, MUX 70 selects the output signal of MUX 30-2 (i.e., g(a,b,c)) to be the carry out signal cout. On the other hand, if p(a,b,c) is logic 1, MUX 70 selects cin to be the cout signal.

The circuitry of logic module 10 that has now been described is capable, in arithmetic mode, of several arithmetic operations. These include one digit or bit of binary addition, subtraction, or multiplication.

In general, the circuitry of logic module 10 is capable of performing one digit of addition on the result of two independent functions f1(a,b,c) and f2(a,b,c). To perform addition of two values f1 and f2, according to one embodiment, it is possible to compute the two logic functions p=f1 XOR f2, and g=f1 AND f2. Then other logic circuitry can compute the sum as sum=p XOR cin, and cout=cin if p=1 or cout=g if p=0.

It can be appreciated that the logic in logic module 10 can be used to compute two arbitrary functions of a, b, and c, by using the top and bottom pairs of modules 20-1/20-2 and multiplexer 30-1, and modules 20-3/20-4 and multiplexer 30-2, respectively. However, since the logic functions f1 and f2 are defined by the user of the circuitry in advance of programming the circuitry, it is also possible to predetermine the functions p=f1(a,b,c) XOR f2(a,b,c) and g=f1(a,b,c) AND f2(a,b,c), and to implement these logic functions in the top and bottom parts of the logic module, respectively. Using this approach, the arithmetic sum of f1+f2 can then be computed using XOR gate 60 and multiplexer 70. This can be illustrated using the examples below.

In the case of binary addition, it is possible to define f1(a,b,c)=a and f2(a,b,c)=b. Therefore, the p function becomes p(a,b,c)=a XOR b, and the g function becomes a AND b. The value of c is immaterial and is held at a constant value, for example 0. The value of d must be set to 0 to allow the sum to be transmitted to the output.

To recapitulate, for one digit of binary addition the bits to be added are supplied via primary inputs a and b. Primary inputs c and d are both held at logic 0 (although primary input c is actually a "don't care" input and could instead be logic 1, with an appropriate shift in which of LUTs 20 are used). LUT 20-1 is programmed to output the XOR of a and b. LUT 20-3 is programmed to output the AND of a and b. Accordingly, sum(a,b,c,cin) is 1 if only one of a, b, and cin is 1, or if all of a, b, and cin are 1. Otherwise sum(a,b,c,cin) is 0. With regard to cout, that signal is 1 only if two or three of a, b, and cin are 1. Otherwise cout is 0. For example, if neither of a and b is 1, p(a,b,c) is logic 0, and MUX 70 outputs g(a,b,c), which is also logic 0. The state of cin does not matter under these conditions of a and b. If one and only one of a and b is 1, p(a,b,c) is logic 1, which causes MUX 70 to output cin. Under these conditions, cout will be 0 if cin is 0, and cout will be 1 if cin is 1. If a and b are both 1, p(a,b,c) is logic 0, which causes MUX 70 to output g(a,b,c), which will be logic 1.

Subtraction is performed substantially like addition. It is assumed in this discussion that the subtraction is a minus b, but it could b minus a if desired. Subtraction is performed by essentially two's-complementing b for addition a. Two's complementing is conventional and involves inverting each bit of a number and adding 1 to the least significant bit of the result. Adding the two's complement of b to a is the same as subtracting b from a. To subtract b from a, LUTs 20-1 and 20-3 are programmed to respond to b as though the bits of b have been inverted from the positive b value to be subtracted from a. Also, cin to the logic module 10 performing the least significant bit position of the arithmetic operation is forced to 1. (For addition (described earlier) this starting cin value is 0. See also the discussion of FIG. 5 below.) In all other respects the circuitry of FIG. 1 operates exactly as in addition.

Multiplication involves multiplying a and b, and adding c and cin to the result to produce sum and cout signals. The value of c to be added is from another partial product (if any) or a summation from other partial products in the same bit position (same arithmetic significance). The sum out signal is c for addition to another partial product; or if there are no more partial products, then the sum out signal is one bit of the final product. The value of cin to be added is cout from the next-less-significant bit position of the partial product formation and accumulation operation being performed.

To perform a multiplication, and considering first the sum-out-forming portion of that operation, LUT 20-1 is programmed to output the AND of a and b, and LUT 20-2 is programmed to output the NAND of a and b. Thus if c is 0, p(a,b,c) is the AND of a and b; and if c is 1, p(a,b,c) is the NAND of a and b. Therefore p(a,b,c) is 1 only if (1) a and b are both 1 and c is 0, or (2) at least one of a and b is 0, but c is 1. The sum(a,b,c,cin) signal will then be 1 only if one and only one of p(a,b,c) and cin is 1.

Considering now the cout-forming portion of a multiplication operation, LUT 20-3 is programmed to output 0 for all values of a and b, and LUT 20-4 is programmed to output the AND of a and b. The circuitry thus provides a cout signal equal to 1 when any two or all three of (1) the product of a and b, (2) c, and (3) cin are 1. Otherwise the cout signal is 0.

Figure 2:
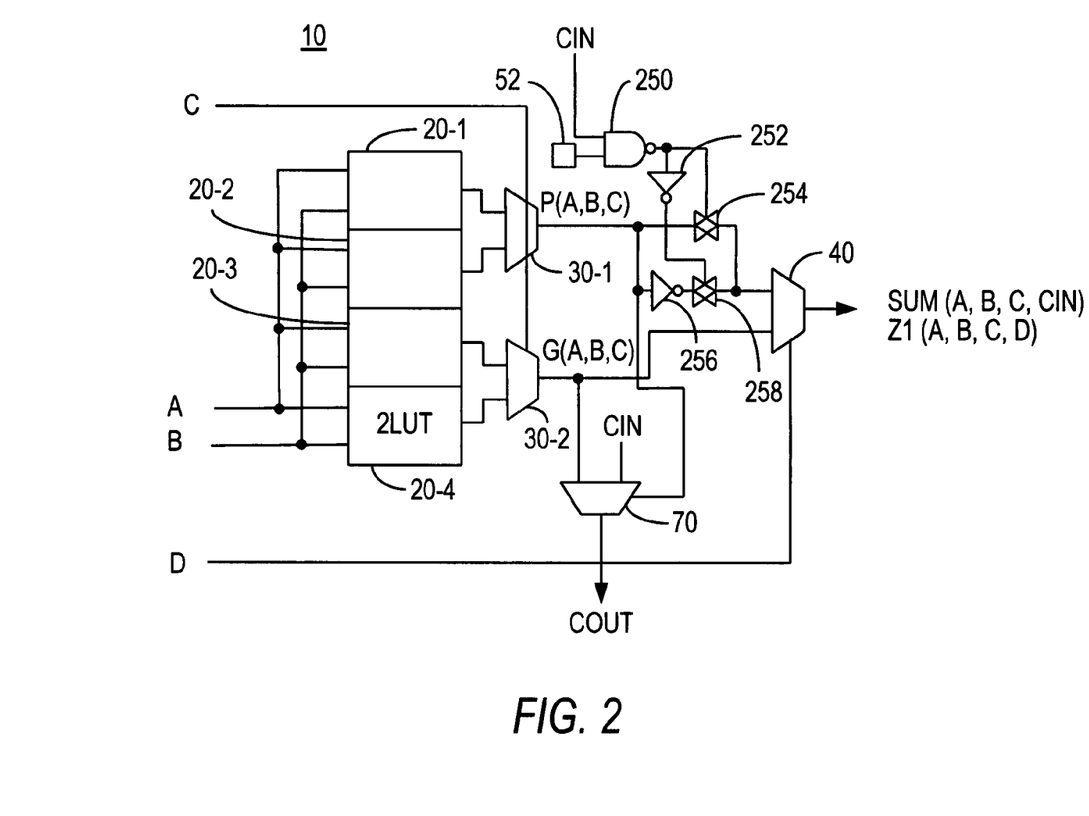
FIG. 2 is a more detailed, but still simplified depiction of what is shown in FIG. 1.

FIG. 2 shows a preferred circuit implementation of circuitry of the type shown in FIG. 1. Elements 50 and 60 in FIG. 1 are implemented in FIG. 2 by NAND gate 250, inverters 252 and 256, and CMOS pass gates 254 and 258. (Although FIG. 2 shows only the active high control signal for each of CMOS pass gates 254 and 258, those skilled in the art will understand that each of these pass gates also requires the complementary signal as a second control input.) The logic is identical to what is shown in FIG. 1. The sizes of the transistors in the LUT multiplexing path (i.e., the transistors in elements 254, 256, 258, 30-1, and 30-2) can be adjusted to trade off the speed in arithmetic mode vs. the speed in combinational logic mode. For example, the transistors in element 254 can be increased in size to speed up the combinational path. Similarly, the transistors in elements 256 and 258 can be decreased in size to reduce the delay impact on the combinational path.

Figure 3:
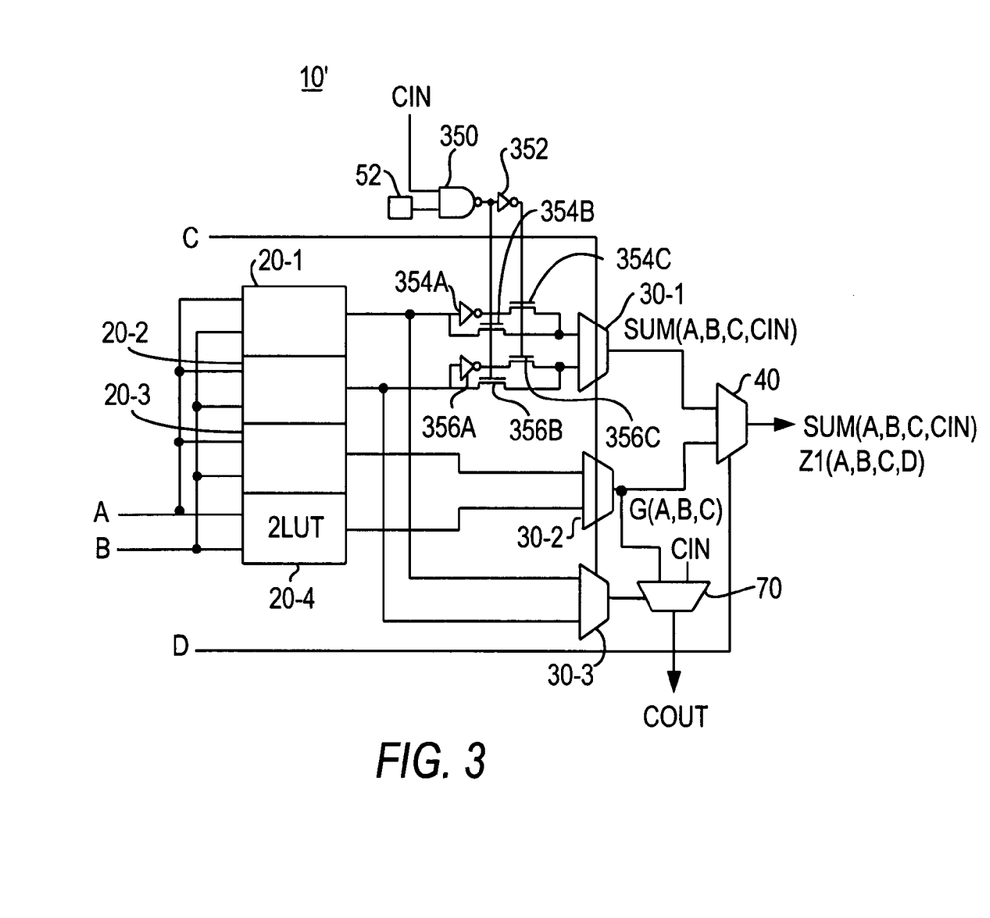
FIG. 3 is a simplified schematic block diagram of an alternative embodiment of logic module circuitry of the general type shown in FIGS. 1 and 2 in accordance with the invention.

A possible disadvantage of circuitry configured as shown in FIGS. 1 and 2 is that the signal path from pins a, b, and c in the logic module go through an additional pass transistor (element 254 in FIG. 2) as compared to logic module circuitry that does not implement arithmetic capability in this way. This possible drawback can be reduced to any degree desired by pushing the XOR gate backwards in the logic module. As it is pushed back, fewer inputs are affected by the delay. FIG. 3 shows a preferred example of this. The FIG. 3 circuitry has all the same arithmetic and combinational logic capabilities as the circuitry of FIGS. 1 and 2.

In FIG. 3 the XOR gate and associated circuitry (elements 350, 354, and 356) are pushed back one stage so that only a and b are affected by the additional logic delay. In a typical implementation, this stage of logic module 10' is implemented using single-ended NMOS pass transistors (like elements 354*b–c* and 356*b–c*), in contrast to the full CMOS MUX (like elements 254/258 in FIG. 2) used for the stages that process the c and d inputs. This means that the same number of pass transistors are required in FIGS. 2 and 3. In addition, the transistors in this stage can be smaller, so the total areas for the multiplexing is reduced. However, an extra inverter is required, which adds some area. Also an additional 2:1 MUX 30-3 is required to generate the p function for carry out multiplexer 70, which also adds area. Nevertheless, the area of the FIG. 3 embodiment can be approximately the same as the area of logic modules that do not implement arithmetic capabilities in the same way, and the present circuitry is more powerful (e.g., it can perform multiplication as well as addition). Note also that the c-to-logic-module-output speed of the FIG. 3 circuitry is greater because c does not go through any input multiplexer (as in some prior designs in which c is muxed with cin) before being input to the logic module.

Figure 4:
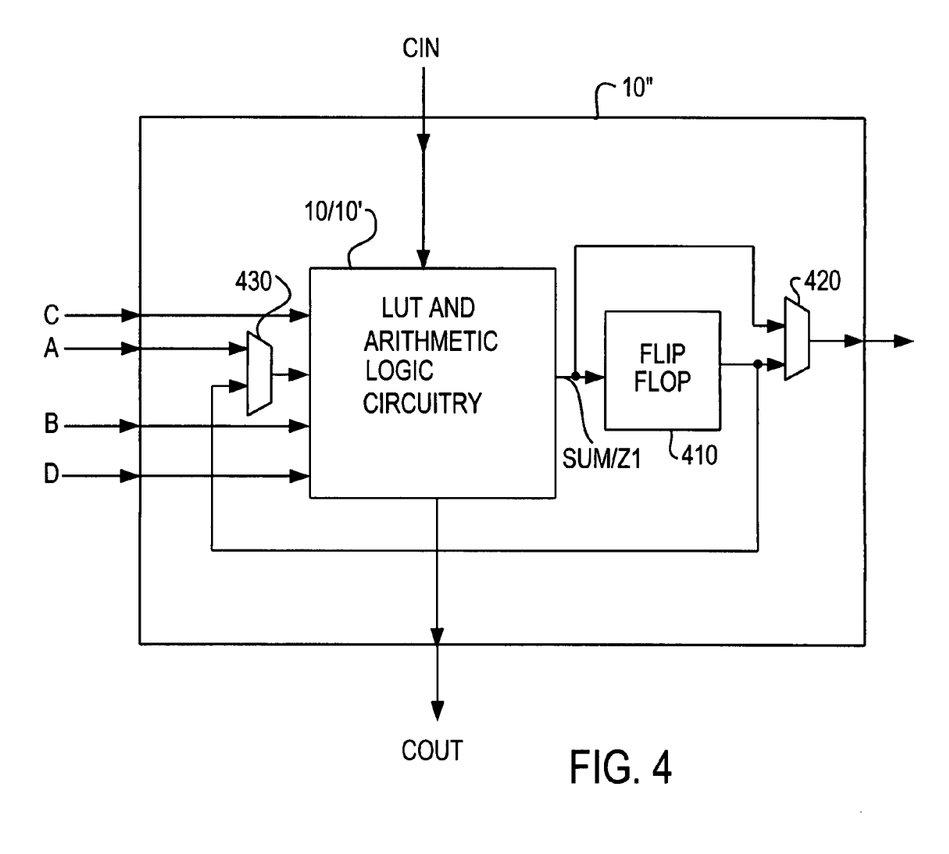
FIG. 4 is a simplified schematic block diagram showing an illustrative embodiment of use of circuitry of the type shown in any of FIGS. 1–3 with other circuit components in accordance with the invention.

Another advantage of the present design is the following. As shown in FIG. 4, it is typical to include in a logic module 10" a flip-flop 410 for registering the primary output signal (sum(a,b,c,cin) or Z1(*a,b,c,d*)) of the LUT circuitry if desired. Some prior logic module designs have a quick feedback multiplexer to allow the flip-flop to drive a logic module input. This is naturally included as an extra input to the c/cin MUX (if there is such a MUX) to minimize hardware. Because the present invention does not require a c/cin MUX, the quick feedback multiplexer 430 can be assigned to any logic module input pin. If assigned to an input pin other than c, this results in a lower delay from c to output, giving circuitry of this invention a lower delay for the c to output path.

Element 420 in FIG. 4 is a conventional multiplexer for allowing flip-flop 410 to be bypassed if desired.

Another possible advantage of the invention is that it allows pins a, b, and c to be used for arithmetic functions. Some prior designs allow only pins a and b to be used. Because pin c is faster, delays from logic module input to output can be faster in arithmetic mode as compared to prior designs in which only a and b can be used in arithmetic mode.

Still another possible advantage of the invention is the following. Some prior designs use an XOR gate on one of the a or b inputs to control whether addition or subtraction is performed. This slows down every single connection that uses that pin, whether in arithmetic or combinational logic mode. The present invention eliminates this, so any added delay of pins a and b is substantially compensated for by the elimination of this XOR gate.

The advantages described in the two preceding paragraphs can be summarized and generalized by saying that, with the invention, all of inputs a, b, and c are logically equivalent and permutable, so that a critical input signal can be routed to any of these input terminals.

Figure 7:
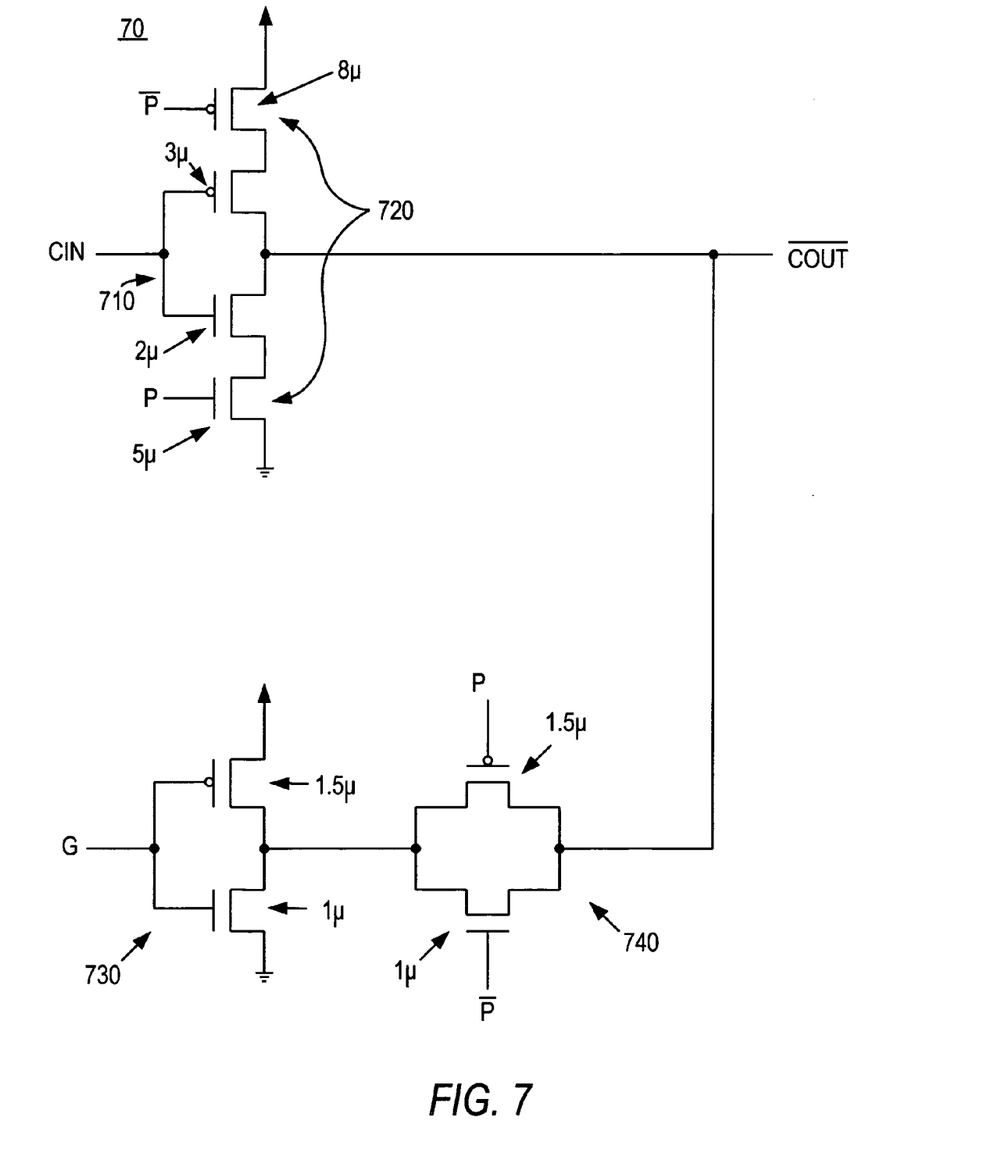
FIG. 7 is a schematic diagram of an illustrative embodiment of one component of logic module circuitry in accordance with the invention.

Finally, the present invention uses a different connection of the cout multiplexer as compared to some prior designs that use cin to control the selection made by the cout multiplexer. With the present invention the critical connection is from data in to out, as opposed to control to out as in some prior designs. As a consequence, it is attractive to use an implementation of the carry out multiplexer 70 that maximizes the speed of the cin to cout path. An embodiment of such a multiplexer 70 is shown in FIG. 7. By using an inverter 710 with a virtual power supply and ground 720 enabled by p, the cin to cout path can be made close to the speed of a single inverter. A lower speed path, enabled by the complement of p, and including an inverter 730 and CMOS pass gate 740, can be used for the g to cout path. The transistor dimensions shown in FIG. 7 are only illustrative and for approximate ratios only.

Figure 5:
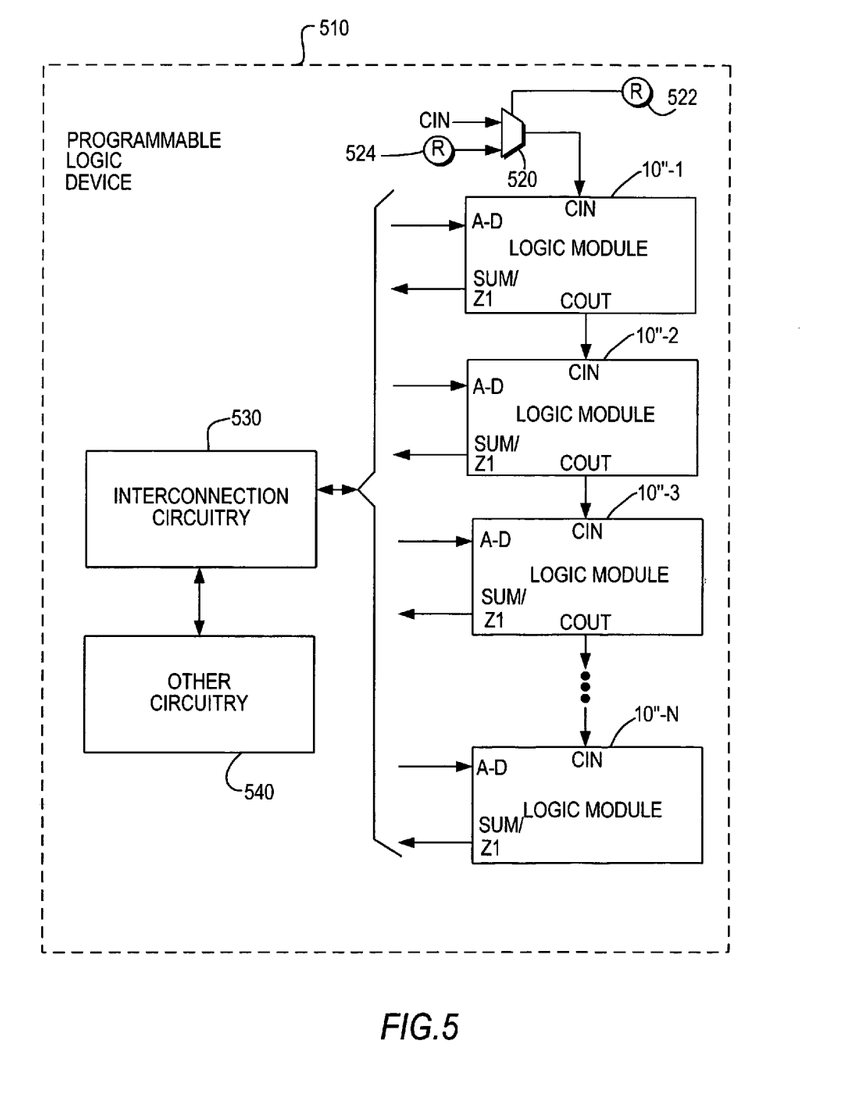
FIG. 5 is a simplified block diagram showing an illustrative embodiment of several instances of circuitry of the type shown in FIG. 4 together with still other circuit components in accordance with the invention.

FIG. 5 shows an illustrative embodiment of circuitry 510 including multiple logic modules 10"-1 through 10"-n in accordance with the invention. Circuitry 510 can be a programmable logic device ("PLD"). Each logic module 10" can be as shown in FIG. 4. Logic modules 10"-1 through 10"-n are connected in a carry chain that begins with the output signal of multiplexer 520. Multiplexer 520 is controllable by programmable RAM cell 522 to output either a cin signal (e.g., from the end of another carry chain) or the output signal of programmable RAM cell 524 (which can be programmed to output either 1 or 0). This circuitry therefore allows the carry chain through depicted logic modules 10"-1 through 10"-n to begin with either a carry in signal from another source or a fixed value that can be either 0 or 1. Circuitry 510 is shown as also including interconnection circuitry 530 (e.g., programmable interconnection circuitry) and other circuitry 540 (e.g., more logic modules, memory blocks, input/output circuitry, etc.). Interconnection circuitry 530 exchanges signals with and routes signals between or among logic modules 10'' and other circuitry 540.

Figure 6:
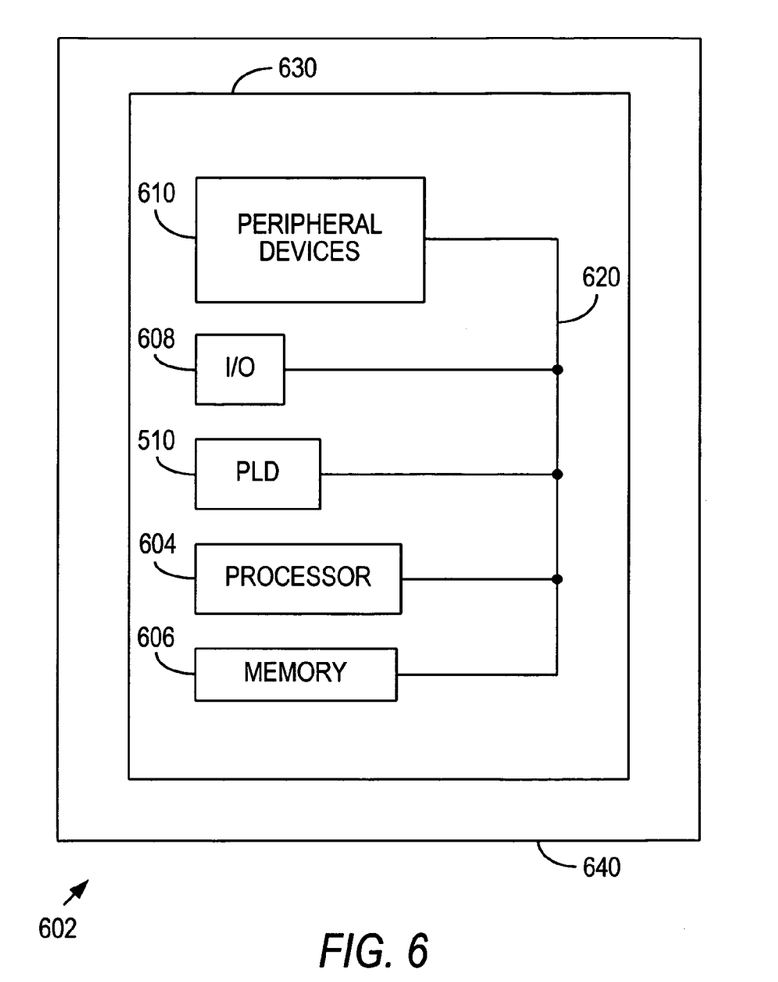
FIG. 6 is a simplified block diagram of an illustrative system employing circuitry in accordance with the invention.

FIG. 6 illustrates a PLD 510 of this invention in a data processing system 602. Data processing system 602 may include one or more of the following components: a processor 604; memory 606; I/O circuitry 608; and peripheral devices 610. These components are coupled together by a system bus or other interconnections 620 and are populated on a circuit board 630 (e.g., a printed circuit board) which is contained in an end-user system 640.

System 602 can be used in a wide variety of applications, such as computer networking, data networking, instrumentation, video processing, digital signal processing, or any other application where the advantage of using programmable or reprogrammable logic is desirable. PLD 510 can be used to perform a variety of different logic functions. For example, PLD 510 can be configured as a processor or controller that works in cooperation with processor 604. PLD 510 may also be used as an arbiter for arbitrating access to a shared resource in system 602. In yet another example, PLD 510 can be configured as an interface between processor 604 and one of the other components in system 602. It should be noted that system 602 is only exemplary, and that the true scope and spirit of the invention should be indicated by the following claims.

Various technologies can be used to implement PLD 510 having the features of this invention, as well as the various components of those devices. For example, the invention is applicable to both one-time-only programmable and reprogrammable devices.

It will be understood that the forgoing is only illustrative of the principles of this invention, and that various modifications can be made by those skilled in the art without departing from the scope and spirit of the invention. For example, any number of logic modules 10'' can be provided on PLD 510. XOR circuitry can be implemented by an XOR gate or any logically equivalent combination of elements. Although ripple carry is assumed in the discussion herein, it will be understood that the invention is equally and straightforwardly applicable to other types of carries such as block carry.

What is claimed is:

1. Logic module circuitry comprising:
   combinational logic circuitry having at least first, second, and third serial stages, each of said stages receiving at an input at least one input signal of the logic module;
   XOR circuitry interposed between two of the stages or between the third stage and an output of the combinational logic circuitry, the XOR circuitry receiving at one input a carry in signal and at another input an output signal of one of the stages of the combinational logic circuitry; and
   multiplexer circuitry for producing a carry out signal by selecting one of the carry in signal and an output signal of one of the stages of the combinational logic circuitry as the carry out signal.

2. The circuitry defined in claim 1 further comprising:
   programmably controlled circuitry for selectively disabling the carry in signal.

3. The circuitry defined in claim 1 wherein the multiplexer circuitry produces the carry out signal from the carry in signal and at least two combinational signals in the combinational logic circuitry.

4. The circuitry defined in claim 1 wherein the multiplexer circuitry uses a first of the combinational signals to control selection of one of the carry in signal and a second of the combinational signals as the carry out signal.

5. Logic module circuitry comprising:
   combinational logic circuitry having at least first, second, and third stages, each of said stages being responsive to at least one input of the logic module;
   XOR circuitry interposed between two of the stages or between the third stage and an output of the combinational logic circuitry, the XOR circuitry receiving at one input a carry in signal and at another input an output signal of one of the stages of the combinational logic circuitry; and
   circuitry for producing a carry out signal from the carry in signal and combinational signals in the combinational logic circuitry comprising:
      multiplexer circuitry for using a first of the combinational signals to control selection of one of the carry in signal and a second of the combinational signals as the carry out signal, wherein the multiplexer circuitry comprises:
         a first path for selectively conveying, at a relatively high speed, signal information indicative of the carry in signal to a lead for signal information indicative of the carry out signal; and
         a second path for selectively conveying, at less than the relatively high speed, signal information indicative of the second of the combinational signals to the lead for signal information indicative of the carry out signal.

6. The circuitry defined in claim 5 wherein the first path comprises:
   an inverter with a virtual power supply and ground enabled by the first of the combinational signals.

7. The circuitry defined in claim 6 wherein the second path comprises:
   an inverter and CMOS pass gate.

8. The circuitry defined in claim 1 wherein the combinational logic circuitry has first, second, third, and fourth stages, and wherein the XOR circuitry is interposed between the third and fourth stages.

9. The circuitry defined in claim 1 wherein the XOR circuitry is interposed between the second and third stages.

10. Logic module circuitry comprising:
    combinational logic circuitry having at least first, second, and third stages, each of said stages being responsive to at least one input of the logic module; and
    XOR circuitry interposed between two of the stages or between the third stage and an output of the combinational logic circuitry, the XOR circuitry receiving at one input a carry in signal and at another input an output signal of one of the stages of the combinational logic circuitry, wherein:
       the third stage has first and second combinational signal outputs, and
       the XOR circuitry logically combines the first combinational signal output with the carry in signal to produce a sum out signal.

11. The circuitry defined in claim 10 further comprising:
    circuitry for producing a carry out signal from the carry in signal and the first and second combinational signal outputs.

12. The circuitry defined in claim 11 wherein the circuitry for producing comprises circuitry for using the first combinational signal output to select one of the carry in signal and the second combinational signal output as the carry out signal.

13. Logic module circuitry comprising:
   combinational logic circuitry having at least first, second, and third stages, each of said stages being responsive to at least one input of the logic module; and
   XOR circuitry interposed between two of the stages or between the third stage and an output of the combinational logic circuitry, the XOR circuitry receiving at one input a carry in signal and at another input an output signal of one of the stages of the combinational logic circuitry, wherein:
   the first and second stages have first, second, third, and fourth combinational signal outputs, and
   first XOR circuitry logically combines the carry in signal with the first combinational signal output and second XOR circuitry logically combines the carry in signal with the second combinational signal output to produce two further signals for application to the third stage.

14. The circuitry defined in claim 13 further comprising:
   circuitry for producing a carry out signal from the carry in signal, the first and second combinational signal outputs, a third stage combinational signal output based on the third and fourth combinational signal outputs, and a third stage input signal.

15. The circuitry defined in claim 14 wherein the circuitry for producing comprises:
   circuitry for using the third stage input signal to select one of the first and second combinational signal outputs as a control signal; and
   circuitry for using the control signal to select one of the carry in signal and the third stage combinational signal output as the carry out signal.

16. The circuitry defined in claim 1 wherein the first and second stages are programmable to produce an output signal that is usable in forming an arithmetic sum of first and second stage input signals.

17. The circuitry defined in claim 1 wherein the first and second stages are programmable to produce an output signal that is usable in forming an arithmetic difference between first and second stage input signals.

18. The circuitry defined in claim 1 wherein the first and second stages are programmable to produce an output signal that is usable in forming an arithmetic product of first and second stage input signals.

19. The circuitry defined in claim 18 wherein the third stage and the XOR circuitry are operable to form the arithmetic sum of the output signal, a third stage input signal, and a carry in signal.

20. A programmable logic device comprising logic module circuitry as defined in claim 1.

21. A digital processing system comprising:
   processing circuitry;
   a memory coupled to said processing circuitry; and
   a programmable logic device as defined in claim 20 coupled to the processing circuitry and the memory.

22. A printed circuit board on which is mounted a programmable logic device as defined in claim 20.

23. The printed circuit board defined in claim 22 further comprising:
   a memory mounted on the printed circuit board and coupled to the programmable logic device.

24. The printed circuit board defined in claim 22 further comprising:
   processing circuitry mounted on the printed circuit board and coupled to the programmable logic device.

25. The method of operating a combinational logic module that includes at least first, second, and third serial stages comprising:
   applying a set of control signals to the first, second, and third serial stages, said control signals being received at at least one input of the logic module;
   using XOR circuitry that is connected between two of the stages or between the third stage and an output of the combinational logic circuitry, the XOR circuitry receiving at one input a carry in signal and at another input an output signal produced by one of the stages of the combinational logic module; and
   producing a carry out signal using multiplexer circuitry to select one of the carry in signal and an output signal of one of the stages of the combinational logic circuitry as the carry out signal.

26. The method defined in claim 25 further comprising:
   programming the first and second stages so that they can produce an output signal that is usable in forming an arithmetic sum of first and second stage input signals.

27. The method defined in claim 26 wherein the using comprises:
   employing the XOR circuitry to produce a further arithmetic sum of the output signal and the carry in signal.

28. The method defined in claim 27 further comprising:
   additionally programming the first and second stages so that they can produce signals for use in providing a carry out signal that results from an arithmetic summation of the first and second stage input signals and the carry in signal.

29. The method defined in claim 25 further comprising:
   programming the first and second stages so that they can produce an output signal that is usable in forming an arithmetic product of first and second stage input signals.

30. The method defined in claim 29 further comprising:
   using the third stage and the XOR circuitry to form an arithmetic sum of the output signal, the carry in signal, and a third stage input signal.

31. The method defined in claim 30 further comprising:
   additionally programming the first and second stages so that they can produce signals for use in providing a carry out signal that results from an arithmetic summation of the output signal, the carry in signal, and the third stage input signal.

32. Logic module circuitry comprising:
   look-up table circuitry having first, second, third, and fourth serial stages, each of said stages receiving at an input at least one input signal of the logic module circuitry;
   XOR circuitry receiving at one input a carry in signal and at another input signal information from a source stage, the XOR circuitry producing further signal information applied to a destination stage, wherein the source stage is selected from the group consisting of the second and third stages, and wherein the destination stage is the third stage if the source stage is the second stage, and the destination stage is the fourth stage if the source stage is the third stage; and
   multiplexer circuitry for producing a carry out signal by selecting one of the carry in signal and an output signal of one of the stages of the look-up table circuitry as the carry out signal.

33. The circuitry defined in claim 32 further comprising:
   circuitry for selectively disabling the carry in signal.

34. The circuitry defined in claim 32 further comprising:
circuitry for producing a carry out signal from at least the carry in signal and signal information from the source stage.

35. Logic module circuitry comprising:
look-up table circuitry having first, second, third, and fourth stages;
XOR circuitry receiving at one input a carry in signal and at another input signal information from a source stage, the XOR circuitry producing further signal information applied to a destination stage, wherein the source stage is selected from the group consisting of the second and third stages, and wherein the destination stage is the third stage if the source stage is the second stage, and the destination stage is the fourth stage if the source stage is the third stage; and
circuitry for producing a carry out signal from at least the carry in signal and signal information from the source stage, wherein the circuitry for producing is connected so that the carry out signal is based in part on a third stage input signal.

36. The circuitry defined in claim 32 wherein the look-up table circuit leading to the XOR circuitry includes circuit elements that are programmable so that the signal information from the source stage that the XOR circuitry receives is indicative of a result of arithmetically adding together first and second stage input signals.

37. The circuitry defined in claim 32 wherein the look-up table circuitry leading to the XOR circuitry includes circuit elements that are programmable so that the signal information from the source stage that the XOR circuitry receives is based at least in part on a result of arithmetically multiplying first and second stage input signals.

* * * * *